Feb. 14, 1950 A. R. ALTER 2,497,571
FREQUENCY DETECTOR AND FREQUENCY CONTROL CIRCUITS
Filed Nov. 29, 1947
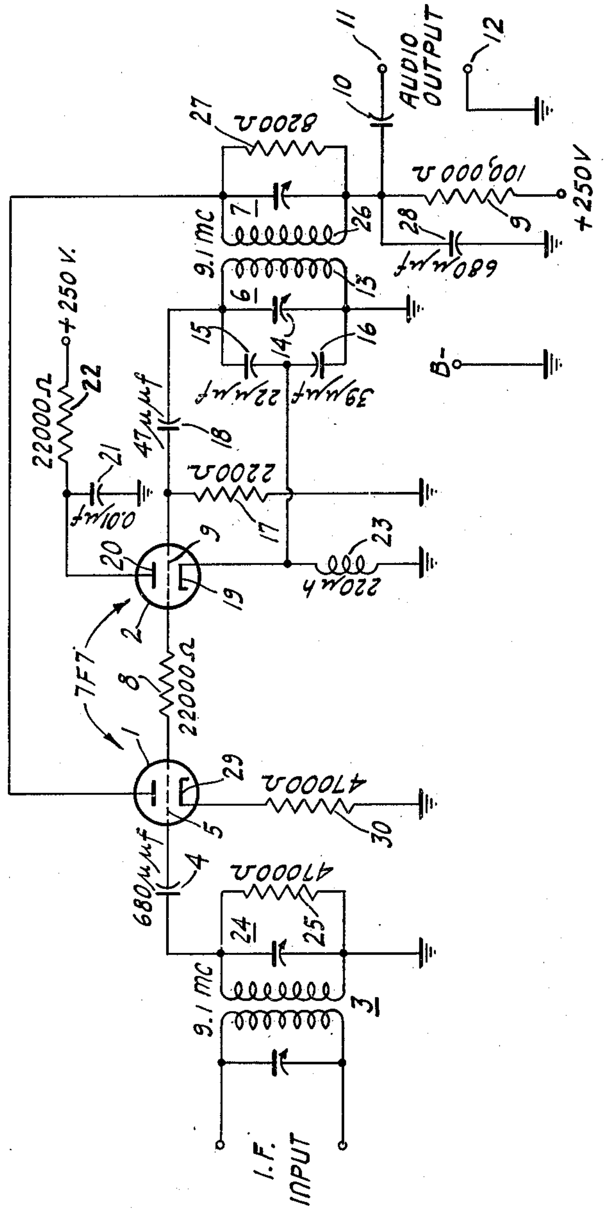
INVENTOR.
ALBERT R. ALTER
BY
Brown, Denk & Synnestvedt
AGENTS Patented Feb. 14, 1950 2,497,571

UNITED STATES PATENT OFFICE 2,497,571

FREQUENCY DETECTOR AND FREQUENCY CONTROL CIRCUITS

Albert R. Alter, Philadelphia, Pa., assignor to Philco Corporation, Philadelphia, Pa., a corporation of Pennsylvania Application November 29, 1947, Serial No. 788,777

11 Claims. (Cl. 250—27)

The invention herein described and claimed relates to electrical circuit arrangements adapted for use in frequency control circuits, frequency modulation detectors, and the like. In one of its more specific aspects, the present invention relates to an improved frequency modulation detector of the synchronized-oscillator type.

A previously developed form of the synchronized-oscillator type of frequency modulation detector is disclosed in a copending application of William E. Bradley, Serial No. 576,057, filed February 3, 1945, now United States Patent No. 2,494,795, issued January 17, 1950. Frequency modulation detectors of the type therein described are now well known in the art, and are employed extensively in frequency modulation radio receivers. A specific commercial embodiment of the detector disclosed in the copending application is described in an article entitled "Single-Stage F-M Detector," published in the October 1946 issue of "Electronics."

The present invention is directed to certain improvements in these detectors which permit the use of simple tube types, for example a pair of triodes, in place of the more complex heptode employed heretofore. It is to be understood, however, that the circuit arrangement of the present invention utilizes the broad novel principles disclosed in the above-identified copending application, distinguishing over other prior detectors of the synchronized-oscillator type in that synchronization of the oscillator section of the detector is by quadrature or wattless control, and not by direct application of the frequency-modulated carrier signal to the oscillator tank circuit. Direct control, or synchronization, of the oscillator by carrier-signal injection is known to be disadvantageous in detectors of the synchronized-oscillator type, since such control increases very substantially the response of the system to amplitude modulation and hence to noise. The present frequency modulation detector, through the use of broad principles disclosed in the above-identified copending application, is highly reliable, and so insensible to noise and to amplitude variations that the use of limiters is unnecessary.

In accordance with one feature of the invention, there is provided a combination oscillator and reactance-tube circuit in which the frequency of the oscillator section may be controlled in accordance with a control voltage applied to the input circuit of the system.

In accordance with another feature of the invention there is provided an oscillator of controllable frequency comprising, in combination, a resonant frequency-determining tank circuit, a pair of vacuum tubes each having at least a cathode, a grid and an anode, a circuit arrangement including one of said tubes and said tank circuit for generating self-sustained oscillations at substantially the resonant frequency of said tank circuit, coupling means for applying said oscillations to the grid-cathode circuit of the other of said tubes, means for grid-biasing said other tube to restrict the flow of plate-current therein to a part only of each cycle of oscillation, means for applying a control voltage to the said grid of said other tube, said control voltage affecting the amplitude of the plate current pulses therein, means for reducing to a negligible value the amplitude of said control voltage applied to said tank circuit by way of said coupling means, and means for applying the oscillation-frequency output of said other tube to said tank circuit in quadrature relation to the oscillations generated therein.

In accordance with still another feature of the invention there is provided a frequency modulation detector of the synchronized oscillator type, said detector comprising: a resonant frequency-determining tank circuit, a pair of vacuum tubes each having at least a cathode, a grid, and an anode, a circuit arrangement including one of said tubes and said tank circuit for generating self-sustained oscillations at substantially the resonant frequency of said tank circuit, coupling means for applying said oscillations to the grid-cathode circuit of the other of said tubes, means for grid-biasing said other tube to restrict the flow of plate current therein to a part only of each cycle of oscillation, a source of frequency-modulated carrier wave, said carrier wave being harmonically related to the resonant frequency of said tank circuit, means for applying said carrier wave to the grid of said other tube, said carrier wave acting to affect the amplitude of the plate current pulses therein, means for reducing to a negligible value the amplitude of said carrier wave applied to said tank circuit by way of said coupling means, means for applying the oscillation-frequency output of said other tube to said tank circuit in quadrature relation to the oscillations generated therein, and an audio frequency load circuit connected in the anode circuit of said other tube.

It is an object of the present invention to provide an improved circuit arrangement for controlling the frequency of an oscillator by the application thereto of a control voltage.

It is another object of the present invention to provide an improved circuit for synchronizing an oscillator with an alternating current signal, either at the signal's fundamental or at a subharmonic thereof.

It is a further object of the present invention to provide a frequency modulation detector which is insensible to amplitude modulation.

It is a further object of the present invention to provide a frequency modulation detector of the synchronized-oscillator type which may be driven from a high impedance source.

It is another object of the invention to provide a frequency modulation detector having a substantially linear operating characteristic, and capable of providing a high level audio output signal.

It is a further object of the invention to provide a novel frequency modulation detector of the synchronized-oscillator type employing vacuum tubes of the simplest construction.

It is still another object of the invention to provide a frequency modulation detector of the synchronized-oscillator type which is so constructed and arranged as to ensure that only reactive control power is supplied to the oscillator.

These and other objects of the invention, and the manner in which they are attained, will appear from the following description and the accompanying drawing in which the single figure is a schematic illustration of a preferred embodiment of the invention.

To facilitate an understanding of the circuit illustrated, the resonant frequency of the tuned circuits and the specific values of the more important electrical components have been indicated directly on the drawing. Although representative of values which have been successfully employed in practice, it will, of course, be apparent to those skilled in the art that these values are subject to considerable variation by the designer.

Briefly, the detector circuit illustrated in the drawing comprises, inter alia: a pair of triodes 1 and 2; a double-tuned input transformer 3 by means of which a frequency-modulated carrier wave—usually at an intermediate frequency—may be applied, by way of the coupling capacitor 4, to the control grid 5 of triode 1; an oscillator tank circuit 6 tuned to the frequency of the applied signal or to a sub-harmonic thereof; a highly-damped resonant circuit 7 tuned to the frequency of tank circuit 6 and adapted to supply the tank circuit 6 with a quadrature control voltage; a connection, including the resistor 8, between the grids 5 and 9 of triodes 1 and 2 respectively; and an audio output circuit including the audio frequency load resistor 9, coupling capacitor 10, and audio output terminals 11 and 12. The triodes 1—2 may conveniently be combined in a single envelope as in the 7F7, a standard double-triode type which has given good performance in physical embodiments of the subject invention.

The oscillator section of the detector is comprised of the tank circuit 6 (which includes inductor 13, tuning capacitor 14, and capacitance divider 15—16), the grid-leak-grid-condenser combination 17—18, and the right-hand triode 2. The foregoing elements constitute a conventional Colpitts oscillator in which the cathode 19 is connected directly to the junction between the capacitors 15—16, the grid 9 is coupled, by way of the capacitor 18, to the high-potential end of the oscillator tank circuit 6, and the anode 20 is returned, by way of capacitor 21 and ground (or chassis), to the low-potential end of the tank circuit 6. Anode voltage is supplied to the anode 20 by way of isolating resistor 22, the direct-current path from the cathode 19 to the negative terminal (B—) of the anode power supply being by way of a suitable R-F choke 23. As in the system described in the above-identified co-pending application, the oscillator is preferably adjusted to operate under Class C conditions wherein plate current flows in relatively short, time-spaced pulses. Although the oscillator illustrated is of the Colpitts type it will be apparent to those skilled in the art, as the description of the device proceeds, that various other oscillator circuits, such as the Hartley or the tuned-plate circuit, may alternatively be employed.

Control grid 9 of oscillator triode 2 is coupled to control grid 5 of triode 1 through the coupling resistor 8. The value of this resistor should be so selected that the voltage across the oscillator tank 6 is applied, with only moderate attenuation, to control grid 5 of triode 1. This requirement is readily met in general if the resistance of the resistor 8 is of the order of, or less than, the impedance presented by the secondary circuit 24 of the signal-input transformer 3. On the other hand, the resistor 8 must have a resistance sufficiently high to isolate, to a substantial extent, the oscillator tank circuit 6 from signal voltages present across the input circuit 24. This requirement is satisfied by ensuring that the resistance of the resistor 8 is large compared to the impedance of the tank circuit 6. Since the impedance of the tank circuit 6 is low compared to that of the tuned input circuit 24 (circuit 6 being heavily loaded by the highly-damped circuit 7 coupled thereto) both of the foregoing requirements are readily met notwithstanding the apparent contradiction. Although the input circuit 24 and the oscillator tank circuit 6 are shown to be damped by the shunt resistor 25 and the coupled circuit 7 respectively, the circuit 7, for a reason to be brought out hereinafter, is far more heavily damped than is the input circuit 24. In general, the input circuit 24 is damped to give relatively uniform response over the expected frequency-deviation range whereas the tuned plate circuit 7 is preferably damped to provide a bandwidth of the order of six times the normal deviation range of the detector. Thus, so long as the source 6 of local oscillation has an impedance which is low compared to the impedance of the source 24 of input signals, it is possible, by means of the isolating resistor 8, to ensure that the locally-developed oscillator voltage is applied, without substantial attenuation to the input signal grid 5 of triode 1, while conversely ensuring that no substantial input signal voltage is applied, by way of the resistor 8, to the oscillator tank circuit 6.

By virtue of the application to the signal grid 5 of substantially full oscillator tank voltage, the plate current in triode 1 is caused to flow in short pulses synchronously with the pulsed flow of plate current in the oscillator triode 2. In the preferred embodiment of the invention both of the triodes are operated under generally similar Class C conditions. Although each of the triodes may be biased individually to ensure the desired operating conditions, it is preferred, in the interests of simplicity, to employ the oscillator grid bias, developed across the grid leak 17, to provide bias for both triodes. In the embodiment illustrated this bias is applied to the grid of triode 1 by way of the aforementioned coupling resistor 8.

In considering the operation of the system illustrated, it will be assumed that the oscillator section of the detector operates under Class C conditions, and that the oscillator voltage is so large compared to the applied input signal voltage that the oscillator voltage alone determines the interval during which plate current flows in triode 1. The effect of the applied intermediate frequency signal, as will be made evident hereinafter, is then primarily to vary the magnitude of the pulses of plate current flowing in the triode 1. This mode of operation represents the ideal mode of operation and can be very closely approached in practice.

Since the tuned plate circuit 7 of the triode 1 is coupled inductively to the oscillator tank 6, it follows that the triode 1 will act to deliver reactive, or phase-quadrature, power to the oscillator tank circuit. This reactive power is, of course, effective to change the frequency of the oscillator in a direction depending upon the sign of the reactive power. This may be either positive or negative depending upon the relative winding directions of the oscillator tank coil 13 and plate tank coil 26.

When the frequency of the applied intermediate frequency signal is equal to the uncontrolled frequency of the oscillator, the tendency is (as in the systems disclosed in the above-identified copending application of William E. Bradley) for the oscillator voltage to assume a phase-quadrature relation to the applied signal.

In this phase-quadrature condition the effective value of the plate current pulses in the triode 1 are not affected by the presence of the input signal, because the pulses of plate current in the triode 1 occur as the intermediate frequency signal voltage applied to the input grid 5 passes through zero. The only effect of the signal voltage on the plate current pulses then is slightly to affect their symmetry while not affecting their energy content. Under conditions of Class C operation this slight lack of symmetry, as shown both by theory and practice, is of no significance.

When, however, the applied signal frequency deviates from a normal center frequency, the pulses of plate current in the triode 1 no longer occur at the instant the signal frequency passes through zero, and accordingly the amplitude of the plate current pulses is effected by the presence of the applied signal. Thus, if the applied signal is going through the positive half of its cycle at the instant of plate-current flow, the magnitude of the plate current pulses is increased by the control effect of the grid 5, whereas, alternatively, if the applied signal is passing through the negative portion of its cycle at this instant the amplitude of the pulses is decreased by the control effect of the grid 5. The timing of the pulses is not, however, affected by the relative phase of the applied input signal, since, as indicated above, the time of current flow in the triode 1 is determined substantially exclusively by the gating action of the oscillator triode 2.

The fundamental-frequency component of output of the triode 1, varying in amplitude in accordance with the frequency-deviation of the applied input signal, is applied, by way of the tuned plate circuit 7, to the oscillator tank circuit 6 where, acting as a reactive control voltage of variable amplitude, it controls the frequency of the oscillator in such manner as to maintain substantial frequency identity between the local oscillator and the applied input signal.

As in the circuit arrangements described in the above-identified copending application of William E. Bradley, the phase relation between the applied signal and the oscillator voltage varies from the normal quadrature relation in accordance with the frequency deviation of the applied signal, but, again as in the Bradley circuits, the reactive control voltage is always in substantially precise quadrature relation with the oscillator voltage. Accordingly the control voltage is capable of discharging its assigned function of frequency control of the oscillator, but is incapable of affecting the amplitude of the oscillator voltage. This is of great importance in any system which is to be substantially insensible to amplitude variation of the received signal and to impulse noise.

As indicated above, when the frequency of the applied signal is deviated, the pulses of plate current in the triode 1 will vary in magnitude correspondingly. Accordingly, if a low-frequency load impedance be provided in the anode circuit of this triode, a voltage will be developed thereacross indicative of the frequency modulation of the applied carrier. In the circuit illustrated this modulation-frequency voltage is developed across the plate load resistor 9. The shunt capacitor 28 which may be associated therewith provides the desired high-frequency deemphasis, and acts as an intermediate frequency filter means between the carrier frequency circuits and the audio frequency output terminals 11-12.

To ensure that the reactive control voltage remain in quadrature with the oscillator tank voltage over the entire band it is desirable to damp the tuned circuit 7 to increase its bandwidth, and preferably this circuit is damped sufficiently to give it a bandwidth of the order of six times the normal deviation range of the detector, as suggested in the above-identified copending application. This damping is provided, in the circuit illustrated, by the shunt damping resistor 27.

Cathode 29 of triode 1 is preferably connected to ground (or chassis) through a resistor 30. The presence of this resistor provides a degenerative effect which enables the circuit to utilize large signal input voltages without overloading.

In systems where the resistance of the aforementioned cathode resistor 30 is high, and the associated cathode-to-ground capacitance, $C_{cg}$ (not illustrated), is substantial, a small phase shift is introduced in the oscillator voltage applied to the grid-cathode circuit of tube 1. This may be disadvantageous in highly refined embodiments of the invention in that the pulses of plate current flowing in tube 1 will not occur in exact synchronism with the pulses of current in the plate circuit of tube 2, with the result that the reactive power applied to the tank circuit 6 by way of the tuned plate circuit 7 will not be precisely in phase quadrature to the oscillator voltage. This dephasing effect can, however, be easily prevented by slightly detuning the tuned secondary circuit of transformer 3 so that it presents a small capacitance $C_{gg}$ (not illustrated), between grid 5 of triode 1 and ground. This capacitance, in combination with the coupling resistor 8, produces a dephasing effect of opposite sign on the voltage applied to the grid-cathode circuit of tube 1, and if the time constants $R_8C_{gg}$ and $R_{30}C_{cg}$ are made equal, at band center, the plate current pulses in the two triodes will occur in substantially precise phase coincidence.

Tests of the circuit of the present invention show that the FM/AM ratio of the detector is better than one hundred to one for a 75 kc. frequency deviation versus thirty percent amplitude modulation. The intermediate frequency sensitivity of the circuit is excellent, requiring only approximately a half volt to ensure proper synchronization of the oscillator for frequency deviations of plus and minus 75 kc. Since the performance of the present circuit is not deleteriously affected by the presence of a high, driving-circuit impedance, it is practical, and indeed desirable, to design the input transformer 3 to give high voltage gain. In tests, the audio frequency output obtained from the system was approximately 3.5 volts R. M. S. with 75 kc. peak deviation. Excellent linearity was obtained throughout the operating range.

As indicated previously the oscillator and frequency-control section of the circuit illustrated in the drawing may, if desired, be adjusted to operate at a sub-harmonic of the frequency of the signal applied to input grid 5, after the manner of sub-harmonic operation described in a copending application of C. T. McCoy, Serial No. 528,908, filed March 31, 1944, now United States Patent No. 2,462,759, issued February 22, 1949. To practice such sub-harmonic operation it is only necessary to resonant the oscillator tank circuit 6 and the associated tuned plate circuit 7 to the desired sub-harmonic frequency, the input circuit 3 being tuned, of course, to the fundamental signal frequency.

Although it is an important aspect of the present invention that a high quality, high level, detected signal may be derived directly from the plate circuit of the triode 1, it will be apparent that the frequency-modulated signal generated by the oscillator section of the circuit may, if desired, be supplied to a conventional frequency discriminator for detection in the usual way. When this mode of operation is employed, the circuit illustrated in the drawing should be regarded, not as a frequency modulation detector, but rather as an arrangement for synchronizing an oscillator with the signals applied to the transformer 3. When such synchronization is the sole object of the circuit, the low-frequency load impedance 9 may, of course, be omitted.

The system hereinbefore described and illustrated may also be employed advantageously as a frequency discriminator in an automatic frequency-control system. In such an arrangement the direct-current or "control" component of the system's output voltage may be derived directly either from the cathode resistor 30 or from the plate load resistor 9, and applied to a suitable frequency-control circuit by way of a low-pass filter, as is customary in the automatic frequency-control art.

Although my invention has been described with particular reference to a specific preferred embodiment, it will be apparent that the invention is capable of other forms of physical expression, and is, accordingly, limited only by the spirit and scope of the appended claims.

I claim:

1. An oscillator of controllable frequency comprising: a resonant frequency-determining tank circuit, a pair of vacuum tubes each having at least a cathode, a grid and an anode, a circuit arrangement including one of said tubes and said tank circuit for generating self-sustained oscillations at substantially the resonant frequency of said tank circuit, coupling means for applying said oscillations to the grid-cathode circuit of the other of said tubes, means for grid-biasing said other tube to restrict the flow of plate-current therein to a part only of each cycle of oscillation, means for applying a control voltage to the said grid of said other tube, said control voltage affecting the amplitude of the plate current pulses therein, means for reducing to a negligible value the amplitude of said control voltage applied to said tank circuit by way of said coupling means, and means for applying the oscillation-frequency output of said other tube to said tank circuit in quadrature relation to the oscillations generated therein.

2. An oscillator of controllable frequency as claimed in claim 1, characterized in that said coupling means comprises a resistor whose resistance is large compared to the resistance of the source of oscillations.

3. An oscillator of controllable frequency as claimed in claim 2, characterized in that said resistor is connected directly between the control grids of said tubes.

4. An oscillator of controllable frequency as claimed in claim 1, characterized in that the grid bias for said other tube is derived from said oscillation generating circuit.

5. An oscillator of controllable frequency comprising: a resonant frequency-determining tank circuit; a pair of vacuum tubes each having at least a cathode, a grid and an anode; a circuit arrangement including one of said tubes and said tank circuit for generating self-sustained oscillations at substantially the resonant frequency of said tank circuit, there being a low-impedance connection between the anode of said one tube and the low-potential end of said tank circuit, a low-impedance connection between the grid of said one tube and the high-potential end of said tank circuit, and a connection between the cathode of said one tube and an intermediate point on said tank circuit; a source of alternating voltage with which it is desired to synchronize said oscillator; means for applying said alternating voltage to the grid-cathode circuit of the other of said tubes; a direct-current connection between the cathodes of said tubes; a direct-current connection, including an isolating resistor, between the grids of said tubes; and a resonant circuit connected in the plate circuit of said other tube and coupled to said tank circuit, said resonant circuit and said tank circuit being tuned to substantially the same frequency, said frequency being harmonically related to the frequency of the alternating voltage supplied by said source.

6. An oscillator of controllable frequency as claimed in claim 5, characterized in that the resistance of said resistor is greater than the impedance presented by said oscillator tank circuit, and less than the impedance of said source.

7. An oscillator of controllable frequency as claimed in claim 6, characterized in that said resonant plate circuit is heavily damped to provide a bandwidth which is equivalent to at least several times the expected frequency deviation range of the voltage from said source.

8. A frequency modulation detector of the synchronized oscillator type, said detector comprising: a resonant frequency-determining tank circuit, a pair of vacuum tubes each having at least a cathode, a grid, and an anode, a circuit arrangement including one of said tubes and said tank circuit for generating self-sustained oscillations at substantially the resonant frequency of said tank circuit, coupling means for applying said oscillations to the grid-cathode circuit of the other of said tubes, means for grid-biasing said other tube to restrict the flow of plate current therein to a part only of each cycle of oscillation, a source of frequency-modulated carrier wave, said carrier wave being harmonically related to the resonant frequency of said tank circuit, means for applying said carrier wave to the grid of said other tube, said carrier wave acting to affect the amplitude of the plate current pulses therein, means for reducing to a negligible value the amplitude of said carrier wave applied to said tank circuit by way of said coupling means, means for applying the oscillation-frequency output of said other tube to said tank circuit in quadrature relation to the oscillations generated therein, and an audio frequency load circuit connected in the anode circuit of said other tube.

9. A frequency modulation detector as claimed in claim 8, characterized in that the coupling means for applying said self-sustained oscillations to the grid-cathode circuit of said other tube also functions to apply to said grid-cathode circuit a negative bias developed by said oscillation generating circuit.

10. A frequency modulation detector as claimed in claim 9, characterized in that said coupling means comprises a resistor whose resistance is much higher than the effective impedance of said resonant frequency-determining tank circuit.

11. A frequency modulation detector as claimed in claim 8, characterized in that said means for applying the output of said other tube to said tank circuit in quadrature relation comprises a resonant circuit having a bandwidth which is at least several times the width of the channel occupied by said frequency-modulated carrier wave.

ALBERT R. ALTER.

REFERENCES CITED

The following references are of record in the file of this patent:

UNITED STATES PATENTS

| Number | Name | Date |
|---|---|---|
| 2,261,286 | Rankin | Nov. 4, 1941 |
| 2,263,615 | Crosby | Nov. 25, 1941 |
| 2,273,771 | Hunt | Feb. 17, 1942 |
| 2,280,525 | Hunt | Apr. 21, 1942 |
| 2,332,540 | Travis | Oct. 26, 1943 |